United States Patent

Boivin et al.

[11] Patent Number: 5,970,348
[45] Date of Patent: Oct. 19, 1999

[54] READ-ONLY MEMORY AND CORRESPONDING METHOD OF MANUFACTURING BY MOS TECHNOLOGY

[75] Inventors: Philippe Boivin, Venelles; Richard Fournel, Lubin, both of France

[73] Assignee: SGS-Thomson Microelectronics S.A., Saint Genis, France

[21] Appl. No.: 08/962,398

[22] Filed: Oct. 31, 1997

[30] Foreign Application Priority Data

Oct. 31, 1996 [FR] France ................................. 96 13372

[51] Int. Cl.$^6$ ............................................. H01L 24/8246
[52] U.S. Cl. ........................................................ 438/286
[58] Field of Search ................................... 438/275, 278, 438/279, 286

[56] References Cited

U.S. PATENT DOCUMENTS

| | | | |
|---|---|---|---|
| 4,683,641 | 8/1987 | Ravindhran et al. | 438/275 |
| 5,472,898 | 12/1995 | Hong et al. | 438/278 |
| 5,480,823 | 1/1996 | Hsu | 438/275 |
| 5,504,030 | 4/1996 | Chung et al. | 438/275 |
| 5,529,942 | 6/1996 | Hong et al. | 438/279 |
| 5,683,925 | 11/1997 | Irani et al. | 438/278 |

FOREIGN PATENT DOCUMENTS

| | | | |
|---|---|---|---|
| 0 302 659 | 2/1989 | European Pat. Off. | H01L 27/10 |
| 0 575 688 | 12/1993 | European Pat. Off. | H01L 27/11 |

*Primary Examiner*—Olik Chaudhuri
*Assistant Examiner*—William David Coleman
*Attorney, Agent, or Firm*—Wolf, Greenfield & Sacks, P.C.

[57] ABSTRACT

In a method for the manufacture of cells of a read-only memory, each cell comprises a MOS transistor formed by a first diffusion and a second diffusion of impurities of a first type in a semiconductor substrate with impurities of a second type. These two diffusions are separated by a channel surmounted by a gate. A thick oxide zone is made in the zone designed for the first diffusion, so that the making of the diffusions leads to a first diffusion in two parts separated by this thick oxide zone, a first part adjoining the channel and a second part on the periphery of the transistor. A particular encoding step makes it possible, by means of a mask, to eliminate the thick oxide in certain cells so that these encoded cells have a first continuous diffusion.

18 Claims, 2 Drawing Sheets

READ-ONLY MEMORY AND CORRESPONDING METHOD OF MANUFACTURING BY MOS TECHNOLOGY

BACKGROUND OF THE INVENTION

1. Field of the Invention

The present invention relates to a read-only memory or ROM and to a corresponding method of manufacture by means of MOS technology.

2. Discussion of the Related Art

Different types of ROM cells are known in the prior art. These cells are based on a MOS transistor. A specific step in the manufacturing method will modify this transistor to obtain a difference in operation between the basic cell and the programmed cell to which the particular step has been applied.

There is a known method of programming cells by forming metal contacts on the gates of the transistors which are selected to be programmed. The gates on the non-programmed cells have no such contacts. It is generally this type of cell that is found in programmable logic arrays. The encoding, i.e., programming of a cell, can be easily detected since it is enough to look at where the metal (aluminum) contacts are placed. Yet, the problem of such a programming method is that the programmed cell takes up a relatively large amount of space (because of the gate metal contacts).

There are other known methods of programming cells that consist of acting on one of the diffusions of the transistor to modify the properties of conduction of these diffusions.

In one such method, there is $N^-$ encoding (programming) (on P type substrate) of the cell, where the non-programmed cell includes a normally doped ($N^+$) diffusion and a diffusion with lower doping ($N^-$ doping). In the encoded or programmed cell, there is only the normally doped $N^+$ diffusion.

In another such method, the basic non-programmable cell has a diffusion with low doping ($N^-$) as above, but the encoded cell has a diffusion with an opposite type of doping (P type) between this diffusion with low doping ($N^-$ type doping) and the channel. This is the encoding by P type counter-doping (for a P type substrate).

All these methods that act on the diffusions have the major drawback of not being able to offer a sufficiently wide differentiation of the currents between the basic non-programmed cell and the encoded or programmed cell. The conductive cell (the basic non-programmed cell in the above description) shows little conductivity, owing to the low doping of the diffusions. On the other hand, the encoded or programmed cell, lets through a leakage current. For these reasons, in order to ensure detection of an encoded cell from a non-encoded cell, it is necessary to have circuits that are specially designed to detect small current differences, the response time of which detection circuits remains very lengthy.

It is also sought to shorten the manufacturing times. It is necessary that the encoding part, which is specific to the customer, should take place as late as possible in the manufacturing process. Also, the smaller the number of manufacturing steps that remain to be performed, the more speedily will the circuit be delivered to the customer. At present, starting from the time when the circuit is ready to be encoded, six to eight weeks are needed to finish a circuit according to the customer's encoding specifications. It is being sought to halve this encoding time so as to shorten the time of delivery of the encoded circuit.

SUMMARY OF THE INVENTION

It is an object of the invention to propose a ROM that provides efficient differentiation between the current of a conductive cell and the current of a non-conductive cell so as to enable sure and speedy detection.

Another object of the invention is to propose a ROM for which the client encoding takes place late in the manufacturing process, so as to obtain the shortest possible time of delivery to the client.

Another object of the invention is to propose a ROM whose encoding is difficult to identify and localize.

According to the invention, therefore, there is proposed a method for the manufacture of cells of a ROM, each cell comprising a MOS transistor formed by a first diffusion and a second diffusion of impurities of a first type in a semiconductor substrate with impurities of a second type, these two diffusions being separated by a channel surmounted by a gate.

According to the invention, a thick oxide zone is made in the zone designed for the first diffusion, so that the making of the diffusions leads to a first diffusion in two parts separated by this thick oxide zone, a first part (1a) adjoining the channel and a second part on the periphery of the transistor (FIG. 1).

The method of manufacture comprises an encoding step which consists of the removal of the thick oxide in each cell to be programmed so that the making of the diffusions leads, for these cells, to a first diffusion that is uninterrupted.

In the making of the electrical contacts, it is planned that the electrical contact of the first diffusion will be made on the second part (1b). The basic cells, with the two parts separated by the thick oxide, are therefore not conductive. The programmed cells are conductive and conduct a strong current since the two diffusions on either side of the channel are normally doped.

BRIEF DESCRIPTION OF THE DRAWINGS

Other features and advantages shall be described in detail in the following description, given by way of an indication that in no way restricts the scope of the invention, and with reference to the appended figures, of which.

DETAILED DESCRIPTION

For the purposes of the description, the invention will be described with reference to an exemplary MOS transistor, having a silicon substrate with P type doping and a thick oxide, in this case, silicon oxide, is used. The invention is not limited to such an example.

Figure 1:
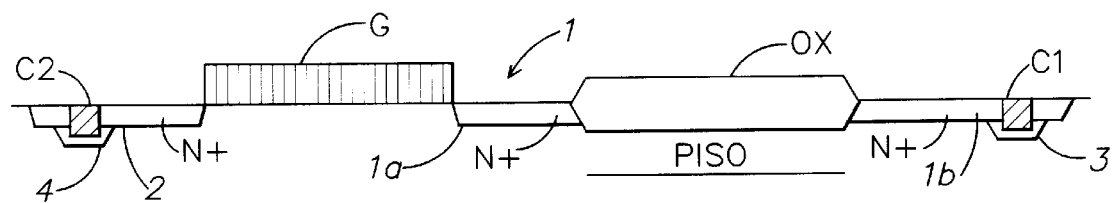
FIG. 1 shows a cross-section of a basic (non-programmed) cell of a read-only memory (ROM) according to the invention.

With reference to FIG. 1, a memory cell, according the invention, comprises a MOS transistor, for example an N type transistor, where the transistor is formed by a gate G that surmounts a conduction channel in the P substrate. On either side of the channel, there is a diffusion 1 and a second diffusion 2, with N type impurities, opposite the substrate.

In the invention, the basic memory cell comprises a thick oxide zone OX that separates the first diffusion into two parts 1a and 1b. The first part 1a adjoins the conduction channel. The second part 1b is on the periphery of the transistor. Electrical contacts C1 and C2, each in the form of a diffusion or a metal line, are designed for the connection of the two diffusions 1 and 2. On the first diffusion 1, electrical contact C1 will be made more particularly on the peripheral part 1b. Finally, the gate itself is generally connected by a polysilicon line of which it is an extension.

If we consider the first diffusion to be the drain and the second diffusion to be the source then, in read mode, a voltage Vg is imposed on the gate, a drain voltage Vd is imposed on C1 and a source voltage Vs is imposed on C2. In practice, the voltage Vg is greater than the threshold voltage VT of the transistor, the voltage Vd is in the range of 5 volts and the voltage Vs is the electrical ground. Because of the thick oxide zone OX that separates the first diffusion 1 into two parts, 1a and 1b, and insulates them from each other, and since the electrical contact C1 is made on the peripheral part 1b, the resultant drain current id is zero.

For a possible electrical connection with a metal line, an ion implantation of N type impurities enables the making of the zones 3 and 4 with greater ($N^{++}$) implantation beneath the contacts C1 and C2, in order to improve the electrical contact with the metal as well as improve the resistance to high voltage.

According to a standard embodiment, there is also a field implantation zone referenced $P^-$iso beneath the thick oxide zone, namely a zone with substantial P ($P^+$) type doping beneath this oxide.

The thick oxide zone, according to the invention, is made in a common step of the manufacturing method corresponding to the making of field oxides usually aimed at insulating the active elements, for example the transistors, from one another.

Figure 2:
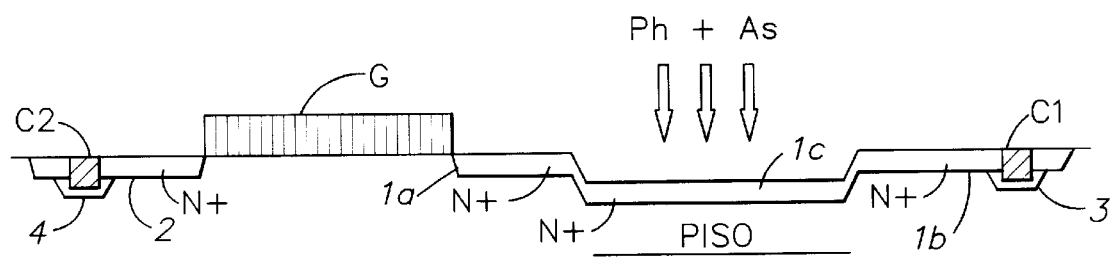
FIG. 2 shows a cross-section of a programmed cell in a read-only memory (ROM) according to the invention.

FIG. 2 shows the memory cell of the invention after programming.

According to the invention, to program the basic cell of FIG. 1, first, the thick oxide zone OX is removed. Thus, during manufacture of the memory cells, it is the encoding step that consists of the removal of the thick oxide from the cells to be programmed by means of an appropriate encoding mask. The removal is done by any appropriate means such as chemical or ion corrosion.

This step of encoding occurs late during the performance of the manufacturing method, typically in the last third of the process.

Once the thick oxide zone OX has been removed, it is possible to carry out the ion implantation of N type impurities, typically a mixture of phosphorous Ph and arsenic As, which corresponds to one of the usual steps of the manufacturing method in which only the P type zones are masked (mask P). For the cells in which the thick oxide has been removed, this implantation step enables the implantation of N type impurities in the zone 1c, in place of the thick oxide zone OX. The implantation of the first diffusion in the two parts 1a and 1b and the zone 1c thus forms a continuous $N^+$ doped zone, namely a zone all in one block. It will be noted, as shown in FIGS. 1 and 2, that a part of the implantation step corresponding to parts of the blank and programmed cells which are identical may be carried out before the encoding step. Alternatively, the implantation step may also be carried out entirely after the encoding step. The timing of the implantation step is not limited by the mode of making the diffusions.

Figure 4:
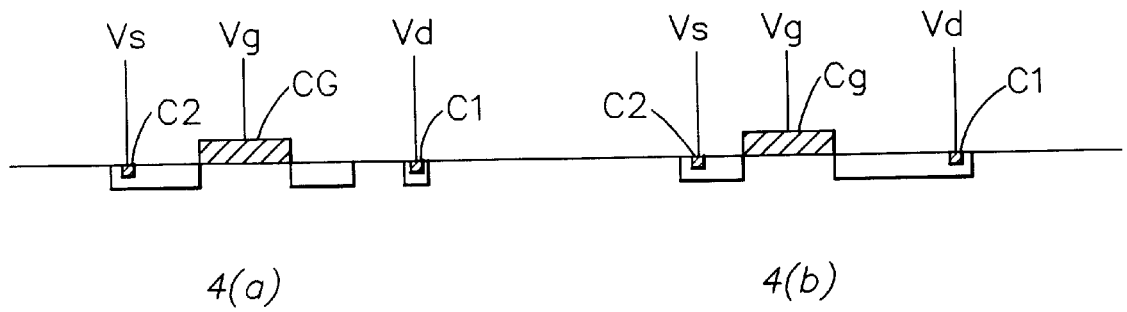
FIG. 4 shows a simplified drawing of memory cells, according to the invention, one cell being programmed (4b) and the other cell being blank (4a).

FIG. 4 shows a simplified drawing of a non-programmed cell (4a) and a programmed cell (4b). As can be seen, the non-programmed cell has the first and second parts of the first diffusion disconnected from each other by the thick oxide layer. In contrast, the programmed cell has the first and second parts of the first diffusion connected to each other, without any discontinuity, due to the removal of the thick oxide layer.

In order to read a programmed cell, as shown in FIG. 4, read voltages Vg, Vd and Vs are applied, respectively, to the electrical contacts CG, C1 and C2 of the cell, resulting in a high drain current id corresponding to the normal operation of the transistor. The current is high for the source drain zones which are normally $N^+$ doped zones.

Figure 3:
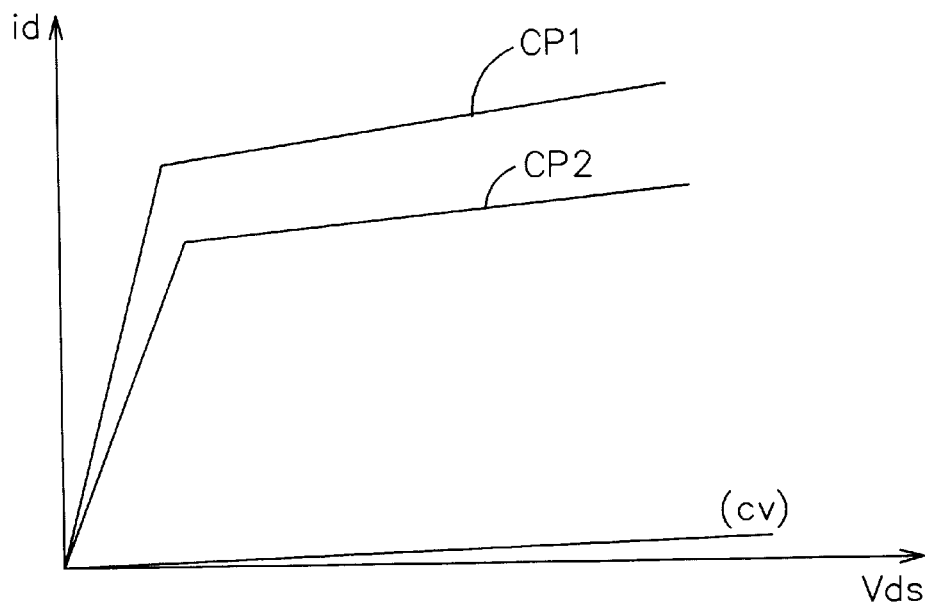
FIG. 3 shows the curves $V_{ds}=f(id)$ for the cells of FIGS. 1 and 2.

Thus, the curves of operation shown in FIG. 3 are obtained. In the case of a non-programmed basic cell CV, because of the thick insulating oxide zone OX, there is a drain current id that has zero value or a very low value irrespective of the drain-source voltages vds applied.

In the case of a programmed cell corresponding to a normal transistor, because the thick insulating oxide zone has been removed, there is obtained a high drain current id as a function of the applied drain-source voltage Vds. This current may vary from one transistor to the other, ranging between values schematically represented as curves CP1 and CP2.

The operation of a non-programmed cell can be compared to a cell having a drain which has been disconnected at a floating potential. The operation of a programmed cell can be compared to a normally operating transistor that is normally biased.

In the practical embodiments, it is necessary to provide for a fairly wide thick oxide to prevent any lateral diffusion. In 0.7 micron technology, a minimum distance of one micron between the gate and the thick oxide and a minimum width of 1.4 microns for the thick oxide zone must be planned.

A ROM may thus include memory cells according to the invention organized conventionally in matrix form in rows and columns, the rows connecting the gates and the columns connecting the drains, the sources of the MOS transistors being connected to a common potential.

The encoding of this memory occurs late in the manufacturing process. In order to program the cells once the thick oxide is removed by means of an appropriate encoding mask, there chiefly remains only the steps of N type ion implantation (by P mask), the making of the metal contacts and the passivation. The memory, according to the invention, therefore, offers two major advantages. First, a very high differentiation of currents between a non-programmed (basic) and a programmed cell exists. Second, a high encoding level is possible, namely encoding or programming of the cell in the last steps of the manufacturing method. Thus, according to the invention, there is a read-only memory in integrated circuit form, in which:

a non-programmed cell comprises a thick oxide zone (OX) separating the first diffusion into two parts (1a and 1b), one part adjoining the channel and the other part (1b) on the periphery bearing the contact of the first diffusion and a programmed cell comprises a first diffusion that is uninterrupted, without a separating thick oxide.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for the manufacture of read-only memory MOS transistor cells, comprising steps of:

forming a semiconductor substrate of impurities of a first type;

forming a first diffusion of a second type of impurities on a first portion of the substrate such that the first diffusion is formed in two parts, a first part of the first diffusion being on the periphery of the substrate;

forming a thick oxide zone between the two parts of the first diffusions;

forming a second diffusion of a second type of impurities on a second portion of the substrate, such that the first and second diffusions are separated by a channel;

forming a gate surmounting the channel, the second part of the first diffusion adjoining the channel.

2. A method of manufacture according to claim 1, wherein the step of forming the thick oxide zone includes forming a thick oxide which is sufficiently wide to prevent any lateral diffusion.

3. A method of manufacture according to claim 1, further including a step of forming electrical contacts on the first and second diffusions and on the gate, the contact of the first diffusion being formed on the first part of the first diffusion.

4. A method of manufacture according to claim 1, further including a step of encoding cells which are selected to be programmed, the encoding step including removal of the thick oxide zone from each cell to be programmed, so that the removal of the thick oxide zone results in the programmed cells having a continuous first diffusion zone, the first and second parts of the first diffusion being connected.

5. A method of manufacture according to claim 4, wherein the step of removing the thick oxide zone is achieved by means of an encoding mask.

6. A method of manufacture according to claim 4, further comprising a step of ion implantation of impurities of the second type in a region previously occupied by the thick oxide zone.

7. A method of manufacture according to claim 6, wherein the step of ion implantation includes implanting impurities of the second type in the region previously occupied by the thick oxide zone until the first and second parts of the first diffusion are continuous.

8. A method of manufacture according to claim 4, wherein the steps of forming the diffusions is carried out prior to the encoding step.

9. A method of manufacture according to claim 6, wherein the step of ion implantation is carried out after the encoding step.

10. A method for the manufacture of electrical connections on a semiconductor substrate comprising the steps of:

forming a semiconductor substrate of impurities of a first type;

forming two or more separated regions of a second type of impurity on the substrate;

forming thick oxide zones between the separated regions.

11. A method of manufacture according to claim 10, wherein the step of forming the thick oxide includes forming a thick oxide which is sufficiently wide to prevent any lateral diffusion.

12. A method of manufacture according to claim 10, further including the step of forming an electrical contact on each separated region.

13. A method of manufacture according to claim 10 further including the step of encoding connections which are selected to be programmed, the encoding step including removal of the thick oxide zone from each connection to be programmed, so that the removal of the thick oxide zone results in the programmed connections have a continuous impurity-containing zone, the separated regions being connected.

14. A method of manufacture according to claim 13, wherein an encoding mask is used to remove the thick oxide zone.

15. A method of manufacture according to claim 13, further comprising the step of ion implantation of impurities of the second type in a region previously occupied by the thick oxide zone.

16. A method of manufacture according to claim 15, wherein the step of ion implantation includes implanting impurities of a second type in the region previously occupied by the thick oxide zone until the separated regions are continuous.

17. A method of manufacture according to claim 13, wherein the step of forming the separated regions is carried out prior to the encoding step.

18. A method of manufacture according to claim 15, wherein the step of ion implantation is carried out after the encoding step.

* * * * *